(12) United States Patent
Grodzki

(10) Patent No.: US 10,371,768 B2
(45) Date of Patent: Aug. 6, 2019

(54) METHOD, COMPUTER AND MAGNETIC RESONANCE APPARATUS FOR PLANNING IMAGING OF A SUBJECT THAT CONTAINS AN IMPLANT

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 173 days.

(21) Appl. No.: 15/408,462

(22) Filed: Jan. 18, 2017

(65) Prior Publication Data

US 2017/0205477 A1 Jul. 20, 2017

(30) Foreign Application Priority Data

Jan. 18, 2016 (DE) .................. 10 2016 200 551

(51) Int. Cl.
*G01V 3/00* (2006.01)
*G01R 33/28* (2006.01)
*G01R 33/54* (2006.01)

(52) U.S. Cl.
CPC ......... *G01R 33/288* (2013.01); *G01R 33/543* (2013.01); *G01R 33/285* (2013.01)

(58) Field of Classification Search
CPC .. G01R 33/288; G01R 33/36; G01R 33/3415; G01R 33/543; G01R 33/285; A61N 1/10534
USPC ........................................... 324/309
See application file for complete search history.

(56) References Cited

U.S. PATENT DOCUMENTS

| | | | | |
|---|---|---|---|---|
| 2010/0121179 A1* | 5/2010 | Min | .................. | G01R 33/583 600/421 |
| 2010/0253338 A1* | 10/2010 | Eryaman | ............. | G01R 33/285 324/309 |
| 2011/0133735 A1* | 6/2011 | Yokosawa | ............. | A61B 5/055 324/307 |
| 2014/0197836 A1* | 7/2014 | Hamamura | ........... | G01R 33/44 324/318 |
| 2016/0331960 A1* | 11/2016 | Katnani | .................. | A61N 1/08 |
| 2017/0212913 A1* | 7/2017 | Kurse | .................... | G06F 19/30 |
| 2018/0172785 A1* | 6/2018 | Leussler | ............. | G01R 33/288 |

OTHER PUBLICATIONS

Eryaman et al.: "Parallel Transmit Pulse Design for Patients with Deep Brain Stimulation Implants"; Magn. Reson. Med., vol. 73, pp. 1896-1903; (2015).

* cited by examiner

*Primary Examiner* — Rodney E Fuller
(74) *Attorney, Agent, or Firm* — Schiff Hardin LLP

(57) ABSTRACT

In a method and computer for planning magnetic resonance imaging of a body of an examination object that contains an implant, to be implemented by a magnetic resonance apparatus, position information of the implant is provided to the computer, the position information characterizing a position of the implant in the body of the examination object, and at least one imaging parameter for the magnetic resonance imaging is predetermined before the imaging. At least one load parameter of the implant is established in the computer on the basis of the acquired position information and the at least one predetermined imaging parameter. The magnetic resonance imaging is planned in the computer on the basis of the established load parameter of the implant.

12 Claims, 2 Drawing Sheets

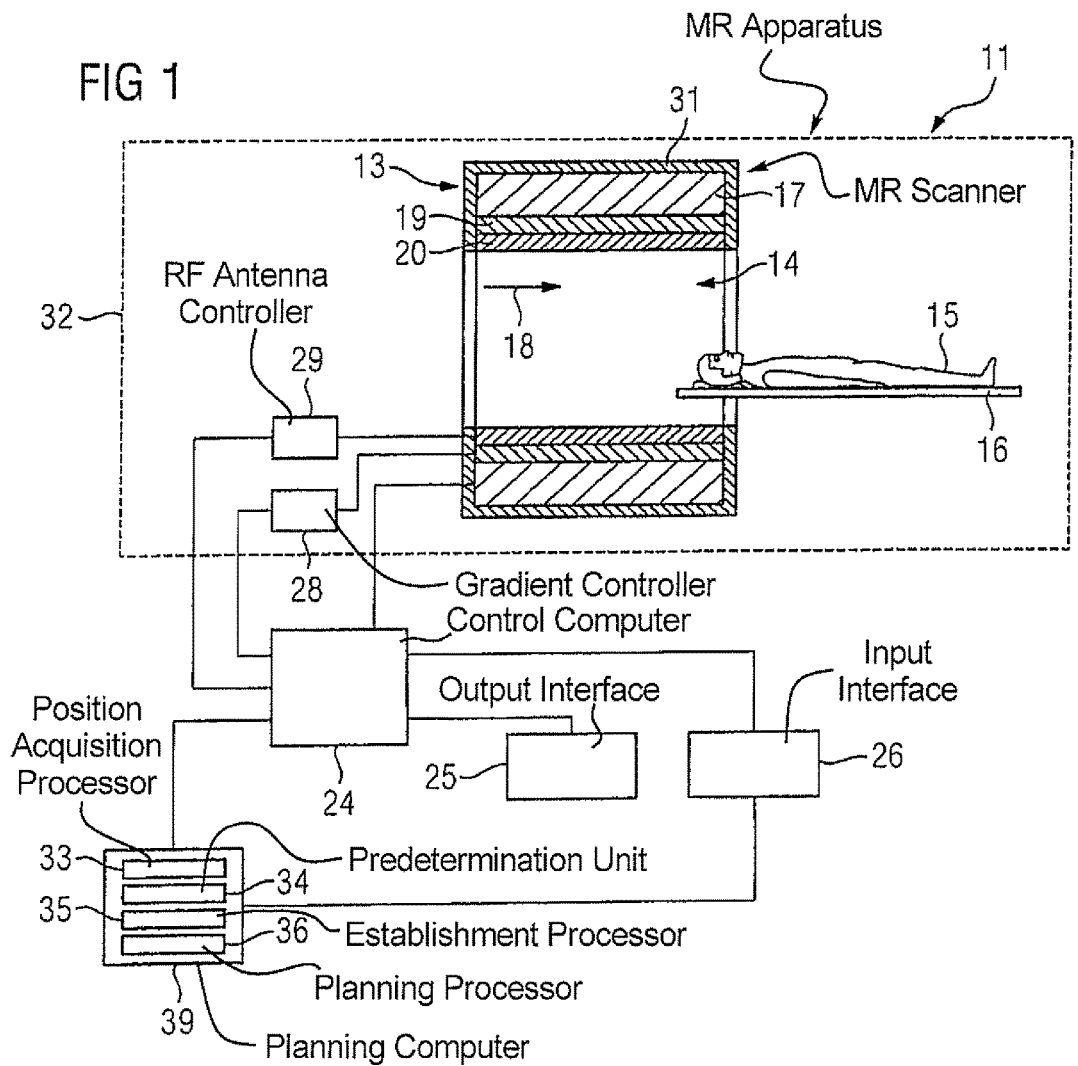
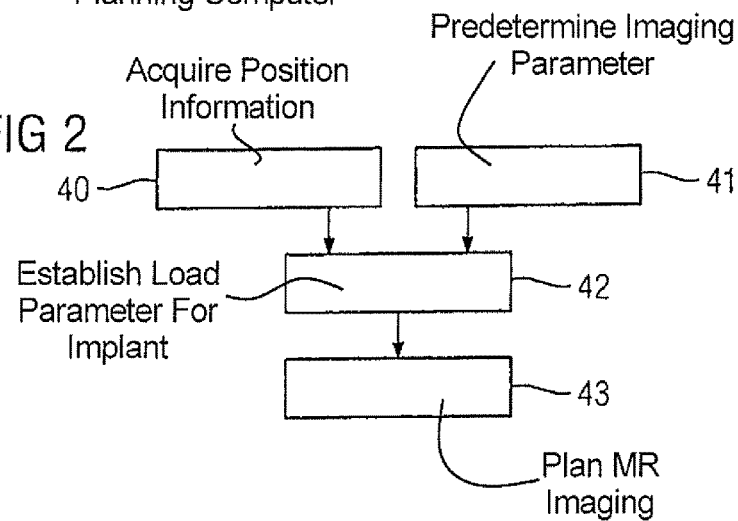

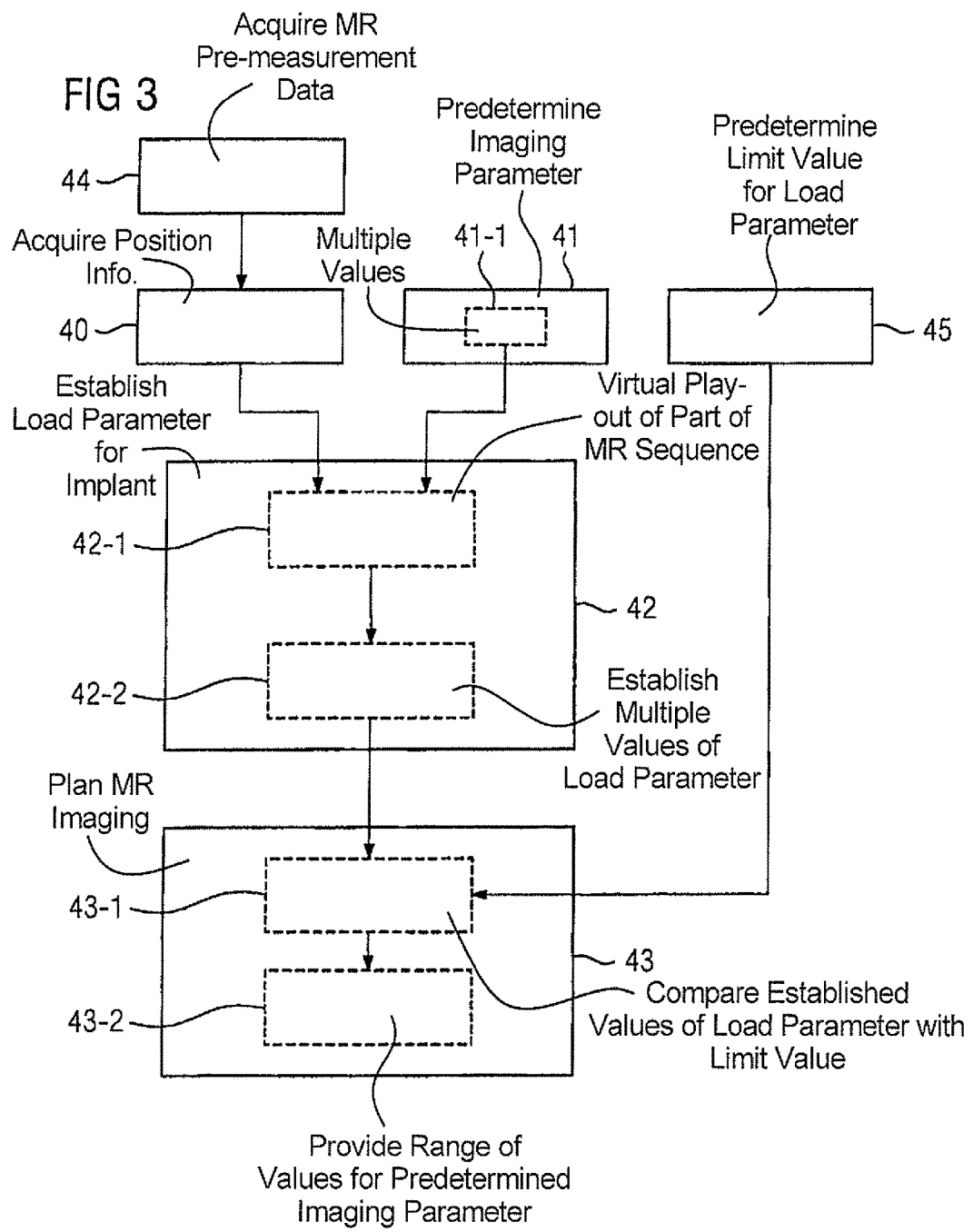

METHOD, COMPUTER AND MAGNETIC RESONANCE APPARATUS FOR PLANNING IMAGING OF A SUBJECT THAT CONTAINS AN IMPLANT

BACKGROUND OF THE INVENTION

Field of the Invention

The present invention concerns a method for planning a magnetic resonance imaging examination of an examination subject that contains an implant, as well as a planning computer for planning such an examination, and a magnetic resonance apparatus and a non-transitory, computer-readable data storage medium for implementing such a method.

Description of the Prior Art

In a magnetic resonance (MR) apparatus, also referred to as a magnetic resonance tomography system, the body of an examination object to be examined, for example a patient, a healthy test subject, an animal or a phantom, is exposed with a basic field magnet system to a relatively high basic magnetic field, for example of 1.5 or 3 or 7 Tesla. In addition, gradient fields are applied with the use of a gradient coil arrangement. Radio-frequency (RF) pulses (excitation pulses), are then radiated by suitable antenna devices via a radio-frequency antenna unit, which leads to the nuclear spin of specific atoms resonantly excited by these radio-frequency pulses being flipped by a defined flip angle in relation to the magnetic field lines of the basic magnetic field. During the relaxation of the nuclear spin, radio frequency signals, so-called magnetic resonance signals, are emitted, which are received by suitable receive antennas and are then further processed. Finally, the desired image data can be reconstructed from the raw data thus acquired.

A specific magnetic resonance sequence, also called a pulse sequence, is activated in order to operate the data acquisition scanner of the MR apparatus for a specific measurement. The pulse sequence is a sequence of radio-frequency pulses, for example excitation pulses and refocusing pulses, as well as gradient pulses to be activated coordinated thereto on different gradient axes in different spatial directions. Readout windows are set, adapted to the aforementioned pulses in time, which predetermine the periods of time in which the induced magnetic resonance signals are acquired.

Magnetic resonance imaging may be implemented for an examination object in whose body an implant is situated. This can be a passive implant, such as an artificial knee joint, an artificial hip, a breast implant, a dental implant, a surgical fixing implant, a clip, an artificial heart valve, or a stent, for instance. It is also possible for an active implant to be located in the examination object, such as a heart pacemaker, a defibrillator, an implant for deep brain simulation (brain pacemaker), a cochlear implant, or a vagus nerve stimulator. Other implants known to those skilled in the art can of course also be situated in the body of the examination object.

The gradient fields or radio-frequency fields created while magnetic resonance imaging is being carried out can be problematic in relation to such an implant in the examination object. For example for a heating of the implant or a malfunction of an active implant to occur during magnetic resonance imaging. Guaranteeing the safety of the examination object and the integrity of the implant located in the examination object during magnetic resonance imaging are therefore of great significance.

SUMMARY OF THE INVENTION

An object of the invention is to improve planning of magnetic resonance imaging of an examination object with an implant therein.

The inventive method for planning magnetic resonance imaging of a body of an examination object by a magnetic resonance device, wherein an implant is located in the body of the examination object, comprises the following method steps:

Acquiring position information of the implant, wherein the position information characterizes a position of the implant in the body of the examination object, and providing this position information to a processor, Predetermining at least one imaging parameter in the processor for the magnetic resonance imaging, Establishing a load parameter of the implant in the processor on the basis of the acquired position information and the at least one predetermined imaging parameter, and Planning the magnetic resonance imaging in the processor on the basis of the established load parameter of the implant and making the plan available in electronic form from the processor.

Information about the presence of the implant in the body of the examination object can be obtained from a consultation with the examination object before planning the magnetic resonance imaging and/or from patient records of the examination object. The procedure described can be carried out when it is discovered that an implant is situated in the body of the examination object.

The acquisition of the position information of the implant can be a determination of a position and/or of a location of the implant in the body of the examination object. The position information can describe the spatial region in the body of the examination object by which the implant is affected. Thus the position information can be information about an alignment and/or a size and/or a shape and/or a position offset of the implant in the body of the examination object. The position information can be acquired on the basis of a priori knowledge about the position of the implant in the body of the examination object. As an alternative or in addition, pre-measurement magnetic resonance data acquired during a pre-measurement by operation of the magnetic resonance scanner can be employed for determining the position information, as will be described in greater detail below.

Imaging parameters can include, for example, basic specifications for the magnetic resonance sequence used for magnetic resonance imaging. For example, the imaging parameter can describe the type of magnetic resonance sequence, i.e. whether the sequence involves a spin echo sequence, a turbo spin echo sequence, etc. Furthermore, the imaging parameter can describe a slice thickness, a slice spacing, a number of slices, a resolution, a repetition time, an echo time, a number of averages etc. Other parameters that are considered relevant by those skilled in the art are of course also conceivable.

The predetermination of the at least one imaging parameter for the magnetic resonance imaging can be a selection of the at least one imaging parameter, in particular for setting a value of the at least one imaging parameter for the magnetic resonance imaging. Thus the at least one imaging parameter can be predetermined by interaction of a user at a user interface. The interaction can be carried out such that the user at the user interface selects a setting module that makes it possible to set the value of the at least one imaging parameter. As an alternative or in addition, the predetermination of the at least one imaging parameter for the magnetic resonance imaging can be the direct predetermination (entry) of a value of the at least one imaging parameter for the magnetic resonance imaging. It is also conceivable for the predetermination of the at least one imaging parameter to be a predetermination of a parameter constellation of a number of imaging parameters.

The load parameter, in particular an established value of the load parameter, can, for example, characterize a heating of the implant during the magnetic resonance imaging and/or a probability of a malfunction of an active implant during the magnetic resonance imaging. As described in greater detail below, there is usually a limit value for the load parameter of the implant that cannot be exceeded during magnetic resonance imaging. The limit value for the load parameter can be specific for different implants. Furthermore, the load parameter to be established can be specific for different implants. A loading of the implant by an absorption of electromagnetic fields, a so-called Specific Absorption Rate loading (SAR loading), can be established as a possible load parameter. A magnetic field change acting on the implant over time, a so-called T/s rate, can be established as a further possible load parameter.

The load parameter is established such that it characterizes a loading of the implant during application of the magnetic resonance sequence at the position of the implant. For this purpose, the load parameter can be established by execution of an algorithm, which uses the position information and the at least one imaging parameter as input parameters and produces the at least one load parameter as an output parameter. The establishment of the load parameter in this case typically involves the establishment of at least one value of the load parameter. In this case, as described in greater detail below, it is often advantageous to establish a number of values of the load parameter. It is also conceivable of course for values of a number of different load parameters to be established.

The load parameter in this case is typically location specific. This means that different values of the load parameter can occur during magnetic resonance imaging at different spatial points in the body of the examination object. The defined radio-frequency pulses and/or gradient pulses from the magnetic resonance sequence, which are used for magnetic resonance imaging, can in this way lead to a higher loading at a first location in the body of the examination object than at a second location in the body of the examination object. It is therefore especially advantageous to establish the load parameter at the position of the implant in the body of the examination object. For this reason the position information of the implant is advantageously taken into account during the establishment of the load parameter. Thus the actual load on the implant during the magnetic resonance imaging can be better estimated.

Since parameters of the radio-frequency pulses and/or gradient pulses of the magnetic resonance sequence are set on the basis of the at least one predetermined imaging parameter, the load parameter occurring during the magnetic resonance imaging depends on the at least one predetermined imaging parameter. The establishment of the load parameter, taking into account the at least one predetermined imaging parameter, thus can be a determination of an effect of the at least one imaging parameter, in particular of a value of the at least one imaging parameter set for the magnetic resonance imaging, on the load parameter.

The load parameter is established before the beginning of the magnetic resonance imaging. Magnetic resonance pre-measurement data can be acquired in a pre-measurement before the actual diagnostic magnetic resonance imaging, in order to establish the load parameter, for example for acquiring the position information. In any event the establishment of the load parameter is concluded before the start of the acquisition of diagnostic magnetic resonance image data of the examination object. In this way the planning of the magnetic resonance imaging can be carried out on the basis of the established load parameter. As described in greater detail below, this can result, during the planning of the magnetic resonance imaging, in only specific values of the at least one imaging parameter being able to be selected on the basis of the established load parameter.

The load parameter should not be established in this way on the basis of the diagnostic magnetic resonance imaging data acquired during the magnetic resonance imaging. Instead the value of the load parameter that occurs during the magnetic resonance imaging, in particular at the position of the implant in the body of the examination object, should be established in a simulation. Input parameters of this simulation are then the position information of the implant and the at least one predetermined imaging parameter.

On the basis of the planning of the magnetic resonance imaging, in particular after definition of the values of all imaging parameters, the diagnostic magnetic resonance imaging of the body of the examination object can be carried out. In this way, magnetic resonance measurement data of the body of the examination object can be acquired during the magnetic resonance imaging. Magnetic resonance image data, which can subsequently be displayed and/or stored, can be reconstructed from the acquired magnetic resonance measurement data (raw data).

The procedure described provides enhanced flexibility in the planning of the magnetic resonance imaging of an examination object with an implant. By taking account of the position of the implant in the body of the examination object, an optimized setting of a value of the at least one imaging parameter in the planning of the magnetic resonance imaging can be achieved. By contrast, in conventional methods the value of the at least one imaging parameter may be restricted during the planning of the magnetic resonance imaging due to an unfavorable location of the implant in the body of the examination object. In such conventional procedures, it can occur that the value of the at least one imaging parameter may be further restricted than is actually necessary during the planning of the magnetic resonance imaging. The inclusion of the position information during the establishment of the load parameter, and thus during the planning of the magnetic resonance imaging, makes it possible to use a smaller tolerance range in the setting of the value of the at least one imaging parameter during the planning of the magnetic resonance imaging. Thus the inventive procedure can make it possible to better optimize the exploitation of a radio frequency power and/or a gradient power during the magnetic resonance imaging. For example, an improved image quality and/or a shortened measurement time thus can be achieved during magnetic resonance imaging. At the same time it is possible, with the inventive procedure, for the safety of the examination object or the integrity of the implant to be guaranteed during the magnetic resonance imaging.

In an embodiment, a limit value is predetermined for the load parameter of the implant, and the planning of the magnetic resonance imaging includes a comparison of the established load parameter with this limit value.

The limit value for the load parameter of the implant can be predetermined on the basis of manufacturer specifications from a manufacturer of the implant. The manufacturer of the implant, because of increasing numbers of patients with implanted implants, considers it important to specify limit values in which the examination object can be safely examined with the respective implant. Then, in the magnetic resonance imaging, attention must be paid to ensure that the limit values specified by the manufacturer are not being exceeded. The limit value for the load parameter of the implant must not be exceeded at the position of the implant in the body of the examination object during the magnetic resonance imaging.

The limit value for the load parameter of the implant can be predetermined directly during a registration of the examination object and/or during a selection of a magnetic resonance sequence before the planning of the magnetic resonance imaging. Possible limit values are, for example, a maximum SAR loading occurring at the position of the implant during the magnetic resonance imaging and/or a maximum T/s rate occurring at the position of the implant during the magnetic resonance imaging.

The comparison of the established load parameter with the limit value of the load parameter can include a check as to whether the established load parameter exceeds the limit value of the load parameter. If it does, then execution of the magnetic resonance imaging, for example with a set value for the at least one predetermined imaging parameter and/or with a specific parameter constellation, can already be prevented during the planning of the magnetic resonance imaging. It is also conceivable, in the planning of the magnetic resonance imaging, for corresponding warnings to be emitted to the operator if the limit value of the load parameter is exceeded.

In an embodiment, magnetic resonance pre-measurement data of the body of the examination object are acquired in a pre-measurement before the planning of the magnetic resonance imaging. The position information of the implant is acquired on the basis of the acquired magnetic resonance pre-measurement data.

The pre-measurement should be concluded before the actual magnetic resonance imaging, in which diagnostic magnetic resonance imaging data of the examination object is to be acquired. The pre-measurement thus is undertaken with the subject in the scanner before the planning of the actual magnetic resonance imaging. The pre-measurement, for example can be recording an overview image of the body of the examination object, based on which the magnetic resonance imaging is subsequently planned.

The position information of the implant can be acquired manually, semi-automatically or automatically on the basis of the acquired magnetic resonance pre-measurement data. For example, a user can define the position information manually on the basis of a presentation of the acquired magnetic resonance pre-measurement data. As an alternative, the position information of the implant can be acquired automatically by a pattern recognition algorithm. In such a way the position information of the implant can be acquired especially easily by use of the pre-measurement.

The pre-measurement is preferably undertaken such that the limit value for the load parameter is not exceeded under any circumstances during the pre-measurement. To insure that this is the case, values for the at least one imaging parameter, in particular in the sense of a fixed parameter option, independent of the position of the implant (which is not even yet known when the pre-measurement is carried out), will be excluded already from the start for the pre-measurement.

In another embodiment, the establishment of the load parameter can be implemented by a virtual playing out of a part of a magnetic resonance sequence used for the magnetic resonance imaging with the at least one predetermined imaging parameter.

The part of the magnetic resonance sequence used for the magnetic resonance imaging can be a representative basic part of the magnetic resonance sequence. For example the part of the magnetic resonance sequence can be a repeating part of the magnetic resonance sequence. It is also conceivable for the part of the magnetic resonance sequence to feature a duration of a repetition time. Furthermore it is conceivable for the part of the magnetic resonance sequence to be an active part, during which a higher density of gradient pulses and/or radio-frequency pulses is applied. It is also conceivable for the entire magnetic resonance sequence to be played out virtually.

The virtual playing out of the part of the magnetic resonance sequence can be abstracted simulation of the part of the magnetic resonance sequence. The virtual playing out of the part of the magnetic resonance sequence can be a simulation of a time characteristic of gradient pulses and/or radio-frequency pulses of the part of the magnetic resonance sequence. To this end the virtual playing out can be a plot of an amplitude curve of the gradient pulses and/or radio-frequency pulses over the period of time of the part of the magnetic resonance sequence. Furthermore the virtual playing out can be a plot of a values derived from the amplitude curve of the gradient pulses and/or radio-frequency pulses, for example a slew rate (time derivative of the gradient amplitude). The gradient pulses and/or radio-frequency pulses can be shown during the virtual playing out in the way that they would have been finally actually applied by hardware of the magnetic resonance scanner in the magnetic resonance imaging.

For virtual playing out of the magnetic resonance sequence the computer of the planning computer can comprise a playout processor. The planning computer can further have an analysis processor for analyzing the time characteristic of the gradient pulses and/or radio-frequency pulses received by the playout processor. The virtual playing out of the magnetic resonance sequence can make possible an especially exact establishment of the load parameter and one that is tailored to the actual circumstances. The timing characteristic of the load parameter can namely be obtained, on the basis of processing specification, especially simply on the basis of the virtual played out timing characteristic of the gradient pulses and/or radio-frequency pulses.

In another embodiment, the effect of gradient pulses and/or radio-frequency pulses of the part of the magnetic resonance sequence on the position of the implant is determined for the establishment of the load parameter on the basis of the virtual playing out of the part of the magnetic resonance sequence.

For this purpose, a timing characteristic of the gradient pulses and/or radio-frequency pulses of the magnetic resonance sequence obtained on the basis of the virtual playing out can be examined. On the basis of the timing characteristic of the gradient pulses, for example a T/s rate at the spatial position of the implant or in the spatial area occupied by the implant can be computed. Spatial screening effects and/or absorption effects of the magnetic resonance sequence can also be examined. On the basis of this examination, it is possible to compute a SAR load to be expected at the spatial position of the implant or in the spatial area occupied by the implant. The part of the magnetic resonance sequence can be played out in this case in specific application cases related to the spatial position of the implant.

As explained in greater detail below, the load parameter established by the virtual playing out, for example the T/s rate and/or the SAR load, can be compared with the respective limit value for the load parameter. If the limit value for the load parameter is exceeded at a point in time, the magnetic resonance sequence thus set can be declared impermissible for the magnetic resonance imaging.

In another embodiment, the establishment of the load parameter includes establishing a number of values of the load parameter on the basis of the established position information and on the basis of a number of values of the at least one predetermined imaging parameter.

The establishment of the number of values of the load parameter can be triggered by a predetermination of the at least one imaging parameter by a user, via a user interface. If the user selects the at least one imaging parameter, for example by a click, then the number of load parameters can be established on the basis of the number of values of the at least one predetermined imaging parameter.

The number of values of the at least one predetermined imaging parameter can be provided or selected automatically in this case. The number of values of the at least one predetermined imaging parameter can be distributed over a possible parameter range of the at least one predetermined imaging parameter. It is conceivable in this case for the selection of the number of values of the at least one predetermined imaging parameter to be carried out by a binary search algorithm for values for the imaging parameter. The binary search can be made in this case for such values for the imaging parameter with which an acceptable magnetic resonance sequence is possible in relation to the limit value of the load parameter.

The number of values of the at least one predetermined imaging parameter can include a first value and a second value of the at least one predetermined imaging parameter. The first value of the at least one predetermined imaging parameter can then be included, together with the position information, in the determination algorithm, wherein a first value of the load parameter is established. Subsequently the second value of the at least one predetermined imaging parameter can be included, together with the position information, in the establishment algorithm, wherein a second value of the load parameter is established. In this way the number of values of the load parameter can be established on the basis of the acquired position information and the number of values of the at least one predetermined imaging parameter. Thus in particular a value of the load parameter can be established for each value of the at least one predetermined imaging parameter.

The effect of a change of the value of the at least one predetermined imaging parameter on the value of the load parameter thus can be examined especially advantageously with this procedure. The information obtained therefrom can be taken into account especially advantageously in the planning of the magnetic resonance imaging.

In another embodiment, the number of values of the load parameter is established on the basis of multiple virtual play outs of the part of the magnetic resonance sequence respectively with the number of values of the at least one predetermined imaging parameter.

The first value of the load parameter of the number of values of the load parameter can be established in this way on the basis of a first execution of the virtual playing out with the first value of the at least one predetermined imaging parameter. The second value of the load parameter of the number of values of the load parameter can thus be determined on the basis of a second execution of the virtual playing out with the second value of the at least one predetermined imaging parameter. In particular the acquired position information of the implant can be taken into account in each case in the virtual playout.

In another embodiment, a limit value for the load parameter of the implant is predetermined, and the number of established values of the load parameter is compared with the limit value for the planning of the magnetic resonance imaging.

In this way a first comparison of the first established value of the load parameter, which is based on the first value of the at least one predetermined imaging parameter, can be carried out with the limit value for the load parameter. Furthermore a second comparison of the second established value of the load parameter, which is based on the second value of the at least one predetermined imaging parameter, can be carried out with the limit value for the load parameter.

In this way the values, with which the at least one predetermined imaging parameter of the limit value for the load parameter can be adhered to in magnetic resonance imaging, can be investigated especially advantageously. If the result of a comparison of an established load parameter of the number of established load parameters with the limit value is that the limit value is exceeded, then carrying out the magnetic resonance sequence with the value of the at least one predetermined imaging parameter, which is based on the establishment of the load parameter, will be forbidden. In this way, permissible values for the at least one imaging parameter can be established step-by-step, for example by a binary search, for which the limit value for the load parameter can be adhered to during the magnetic resonance imaging.

In another embodiment, a range of values that can be set for the at least one predetermined imaging parameter is provided at a user interface on the basis of the established load parameter for the planning of the magnetic resonance imaging.

In this case the user interface is used by an operator for setting the value of the at least one predetermined imaging parameter for the magnetic resonance imaging. The range of values able to be set for the at least one predetermined imaging parameter encompasses those values of the at least one predetermined imaging parameter, with which magnetic resonance imaging is possible within the limit value for the load parameter of the implant. In this way only specific values for the at least one predetermined imaging parameter can already be allowed during the setting of the magnetic resonance sequence for the magnetic resonance imaging. A selection of values of the at least one predetermined imaging parameter that lie outside the range of values able to be set for the magnetic resonance imaging can be forbidden at the user interface. For example, such impermissible values can simply not be displayed at the user interface and/or overlaid with gray and/or be stored as colored (for example red) values.

In another embodiment, the range of values able to be set for the at least one predetermined imaging parameter is provided on the basis of the comparison of the number of established values of the load parameter with the limit value.

In this way, only those values for the at least one predetermined imaging parameter can already be allowed during the setting of the magnetic resonance sequence for the magnetic resonance imaging for which a limit value for the load parameter of the implant can be adhered to during the magnetic resonance imaging, taking into account the position of the implant. Of course this procedure can also be expanded to parameter constellations of numbers of imaging parameters, so that specific parameter constellations are only allowed for the measurement on the basis of the limit value of the load parameter.

The inventive planning computer includes a calculation processor, which includes a position acquisition processor, a predetermination processor, an establishment processor and a planning processor, with the overall planning computer being configured to implement the inventive method.

The overall planning computer is configured to execute the method for planning magnetic resonance imaging of a body of an examination object, by operation of a magnetic imaging device, as described above, wherein an implant is situated in the body of the examination object. The position acquisition processor is configured to acquire position information of the implant, the position information characterizing a position of the implant in the body of the examination object. The predetermination processor is configured to predetermine at least one imaging parameter for the magnetic resonance imaging. The establishment processor is configured to establish a load parameter of the implant on the basis of the acquired position information and the at least one predetermined imaging parameter. The planning processor is configured to plan the magnetic resonance imaging on the basis of the established load parameter of the implant.

The inventive magnetic resonance apparatus includes such an inventive planning computer. The planning computer is configured to send control signals to the magnetic resonance scanner and/or to receive control signals and/or to process such signals, in order to carry out the inventive method. The planning computer can be integrated in the magnetic resonance apparatus. The planning computer can also be installed separately from the magnetic resonance apparatus. The planning computer can be connected to the magnetic resonance apparatus.

The invention also encompasses a non-transitory, computer-readable data storage medium encoded with programming instructions that, when the storage medium is loaded into a computer, cause the computer to implement the method as described above when the programming instructions (program code) are executed in the computer. The computer must have components such as an appropriate main memory, graphics card, or logic unit for example, so that the respective method steps can be carried out efficiently. Examples of electronically-readable data carriers are a DVD, a magnetic tape or a USB stick, on which electronically-readable control information, in particular software (cf. above) is stored.

The advantages of the inventive planning computer, the inventive magnetic resonance apparatus and the inventive storage medium essentially correspond to the advantages of the inventive method that have been described in detail above. Features, advantages or alternate embodiments mentioned above are applicable to the other aspects of the invention. The functional features of the method are executed by corresponding physical modules, in particular by hardware modules.

The components of the inventive planning computer, namely the position acquisition processor, predetermination processor, establishment processor and the planning processor, can be embodied in the form of software components. Some or all of these components, particularly when especially fast computations are involved, can also be realized in the form of software-supported hardware components, for example FPGAs or the like. Likewise the interfaces needed, for example when only a transfer of data from other components is involved, can be embodied as software interfaces. They can also be embodied as hardware based interfaces that are activated by suitable software. Of course it is also conceivable for a number of the aforementioned components to be combined in the form of an individual software component or software-supported hardware component.

BRIEF DESCRIPTION OF THE DRAWINGS

FIG. 1 is a block diagram of an inventive magnetic resonance apparatus with an inventive planning computer.

FIG. 2 is a flowchart of a first embodiment of the inventive method.

FIG. 3 is a flowchart of a second embodiment of the inventive method.

DESCRIPTION OF THE PREFERRED EMBODIMENTS

FIG. 1 is a block diagram of an inventive magnetic resonance apparatus 11 with an inventive planning computer 39.

The magnetic resonance apparatus 11 has a scanner 13 with a basic field magnet 17 that produces a strong and constant basic magnetic field 18. The magnetic resonance scanner 13 also has a cylindrical patient receiving area 14 for receiving an examination object 15, in the present case a patient. The patient receiving area 14 is surrounded circumferentially by the scanner 13 in a cylindrical shape. The patient 15 can be moved by a patient support 16 of the scanner 13 into the patient receiving area 14. To this end, the patient support 16 has a support table, which is movable within the scanner 13. The scanner 13 is shielded from the outside by a housing shell 31.

The scanner 13 further has a gradient coil arrangement 19 to generate magnetic field gradients, which are used for spatial encoding during imaging. The gradient coil arrangement 19 is operated by a gradient controller 28. Furthermore the scanner 13 has a radio-frequency antenna 20 that, in the shown embodiment, is a body coil permanently integrated into the scanner 13. The radio-frequency antenna unit 20 is activated by a radio-frequency antenna controller 29 so as to radiate radio-frequency magnetic resonance sequences into an examination area, which is essentially formed by the patient receiving area 14. The radio-frequency magnetic resonance sequences cause nuclear spins of certain atoms in the patient 15 to be excited, so as to deviate from the polarization (steady state) produced by the basic magnetic field 18. As the excited nuclear spins relax and return to the steady state, they emit radio-frequency signals known as magnetic resonance signals. The radio-frequency antenna 20 is further designed for receiving the magnetic resonance signals from the patient 15.

For control of the basic field magnet 17, the gradient controller 28 and the radio-frequency antenna controller 29, the magnetic resonance apparatus 11 has a control computer 24. The control computer 24 centrally controls the magnetic resonance apparatus 11, such as for carrying out a predetermined imaging gradient echo sequence. Control information, such as imaging parameters, as well as reconstructed magnetic resonance images, can be made available for a user at an output interface 25, in the present embodiment as a display. The control computer 24 can include the gradient controller 28 and/or the radio-frequency antenna controller 29 and/or the output interface 25 and/or an input interface 26, via which an operator can enter control commands and parameters. The input interface 26 can include the screen of the display and/or a keyboard and/or a mouse.

The magnetic resonance apparatus 11 can of course have further components that magnetic resonance apparatuses usually have. The general mode of operation of a magnetic resonance apparatus is known to those skilled in the art, so that a more detailed description of the further components and operation is not necessary herein.

In the shown embodiment, the magnetic resonance apparatus 11, in particular the control computer 24 thereof, is connected to the planning computer 39. The planning computer 39, in the embodiment shown has a position acquisition processor 33, a predetermination unit 34, an establishment processor 35 and a planning processor 36. In addition the planning computer 39 is connected to the input unit 26, via which information and/or parameters can be entered by a user for the planning of a magnetic resonance examination. The magnetic resonance apparatus 11 is thus designed, together with the planning computer 39, to execute the inventive method for planning magnetic resonance imaging of a body of the examination object 15. The planning computer 39 can of course also be embodied independently of the magnetic resonance apparatus 11 in order to execute the inventive method.

FIG. 2 is a flowchart of a first embodiment of the inventive method for planning magnetic resonance imaging of a body of an examination object 15, wherein an implant is situated in the body of the examination object 15.

In a first method step 40, position information of the implant is acquired by means of the position acquisition processor 33. This position information characterizes a position of the implant in the body of the examination object.

In a further method step 41, at least one imaging parameter for the magnetic resonance imaging is predetermined by the predetermination processor 34.

In a further method step 42, a load parameter of the implant is established on the basis of the acquired position information and the at least one predetermined imaging parameter by the establishment processor 35.

In a further method step 43, planning of the magnetic resonance imaging on the basis of the established load parameter of the implant is undertaken by the planning processor 36.

FIG. 3 is a flowchart of a second embodiment of an inventive method for planning magnetic resonance imaging of a body of an examination object 15.

The description given below is essentially restricted to the differences from the exemplary embodiment in FIG. 2, wherein, as regards method steps, which remain the same, the reader is referred to the description of the exemplary embodiment in FIG. 2. Method steps, which essentially remain the same, are basically given the same reference numbers.

The embodiment of the inventive method shown in FIG. 3 essentially includes the method steps 40, 41, 42, 43 of the first form of embodiment of the inventive method according to FIG. 2. In addition the form of embodiment of the inventive method shown in FIG. 3 contains additional method steps and substeps. An alternate method sequence to that shown in FIG. 3 is also conceivable, which has only some of the additional method steps and/or substeps shown in FIG. 2. Of course an alternate method sequence to that shown in FIG. 3 can also have additional method steps and/or substeps.

In a further method step 44, in the case shown in FIG. 3 magnetic resonance pre-measurement data of the body of the examination object 15 are acquired before the planning of the magnetic resonance imaging in a pre-measurement. The acquisition of the position information of the implant in further method step 40 can then be undertaken on the basis of the acquired magnetic resonance pre-measurement data. Of course other methods of operation for acquiring the position information of the implant are also conceivable.

Furthermore, in a further method step 45, a limit value for the load parameter of the implant is predetermined. The planning of the magnetic resonance imaging can then later include a comparison of the established load parameter with the limit value.

In the exemplary embodiment in accordance with FIG. 3 a number of values of the at least one predetermined imaging parameter are further predetermined in a substep 41-1 of the further method step 41.

In accordance with FIG. 3 the establishment of the load parameter, in a first substep 42-1 of the further method step 42, includes a virtual playing out of a part of a magnetic resonance sequence used for the magnetic resonance imaging with the at least one predetermined imaging parameter. In this case an effect of gradient pulses and/or radio-frequency pulses of the part of the magnetic resonance sequence on the position of the implant is determined, in particular for the establishment of the load parameter.

In a second substep 42-2 of the further method step 42 in particular a number of values of the load parameter are established on the basis of the acquired position information and on the basis of the number of predetermined values of the at least one predetermined imaging parameter. For this purpose, in the first substep 42-1 of the further method step 42, a multiple virtual playing out of the part of the magnetic resonance sequence with the number of values of the at least one predetermined imaging parameter can be carried out.

The planning of the magnetic resonance imaging in the further method step 43, in the case shown in FIG. 3, includes a comparison of the number of established values of the load parameter with the limit value for the load parameter of the implant predetermined in further method step 45 in a first substep 43-1 of the further method step 43. For the planning of the magnetic resonance imaging, in a second substep 43-2 of the further method step 43 a range of values that can be set for the at least one predetermined imaging parameter can be provided at a user interface on the basis of the established load parameter. The range of values able to be set for the at least one predetermined imaging parameter can be provided on the basis of the comparison of the number of established values of the load parameter with the limit value.

The calculation of a change of magnetic field acting on the implant over time (T/s rate) as a result of a magnetic field gradient acting on the implant will be described as an example for a possible calculation of a load parameter in further method step 42. Of course this example is one possibility. All numerical values used in the example are only provided for illustration and a method of operation other than that described in the example can be employed.

The result of the position information of the implant established in further method step 40 is that the implant is positioned by a vector R=(0,0, 5 cm) relative to the isocenter of the magnetic resonance device, i.e. 5 cm away from the isocenter of the magnetic resonance device in the z-direction, in the body of the examination object 15. On the basis of the virtual playing out of the part of the magnetic resonance sequence in the first substep 42-1 of the further method step 42, for each point in time i of the part of the magnetic resonance sequence, on the basis of the gradient curve the T/s rate at the position of the implant can be determined. For this it can be assumed that the magnetic field of each point in time i at the position of the implant amounts to the following:

$$B_i=(0,0,B_0+Gz_i*R)=(0,0,B_0+Gz_i*5 \text{ cm})$$

In this equation $B_0$ is the main magnetic field in the z-direction. $Gz_i$ in this case is the gradient field in the z-direction at point in time i. Now the difference from the preceding value $B_{i-1}$ can be formed and the Euclidian sum over the three spatial directions can be formed. A value for the T/s rate at the position of the implant can thus be obtained. Of course higher terms of the gradient field, which are aligned for example in the x-direction or in the y-direction, can also be taken into account. Such higher terms of the gradient field can arise because of eddy currents or can be concomitant gradient fields.

The method steps of the inventive method shown in FIG. 2-3 are executed by the computer 24. To this end, the computer 24 is loaded with software and/or computer programs, which are stored in a memory of the computer 24. The software and/or computer programs include program code that cause the inventive method to be executed when the program code is executed in the computer 24.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for planning acquisition of magnetic resonance data from a subject having a body in which an implant is situated, said method comprising:
   providing a computer with position information that describes a position of the implant within the body of the subject;
   in said computer, predetermining at least one imaging parameter for use in acquiring magnetic resonance data from the subject by operation of a magnetic resonance data acquisition scanner in a magnetic resonance data acquisition procedure;
   in said computer, establishing a load parameter of the implant dependent on the position information and the at least one predetermined imaging parameter, by executing a virtual playing out of a portion of said magnetic resonance data acquisition procedure with said at least one predetermined imaging parameter; and
   in said computer, planning, dependent on said load parameter, operation of the magnetic resonance data acquisition scanner to acquire said magnetic resonance data from the subject, and thereby generating a planned version of said magnetic resonance data acquisition procedure, and emitting an electronic representation from the computer of the planned version of said magnetic resonance data acquisition procedure in a format for operating the magnetic resonance data acquisition scanner.

2. A method as claimed in claim 1 comprising establishing a limit value for said load parameter of the implant in said computer, and planning the magnetic resonance data acquisition procedure by comparing the established load parameter with said limit value.

3. A method as claimed in claim 1 comprising:
   operating said magnetic resonance data acquisition scanner with the examination subject therein to execute a pre-measurement, prior to operating said magnetic resonance data acquisition scanner with said planned version of said magnetic resonance data acquisition procedure, in order to acquire pre-measurement magnetic resonance data from the body of the examination subject;
   providing said pre-measurement magnetic resonance data to said computer; and
   in said computer, determining said position information of the implant from said pre-measurement magnetic resonance data.

4. A method as claimed in claim 1 wherein said magnetic resonance data acquisition scanner comprises a gradient coil arrangement at activates gradients during said magnetic resonance data acquisition procedure, and a radio-frequency coil that radiates radio-frequency pulses during said magnetic resonance data acquisition procedure, and wherein said method comprises determining an effect of at least one of said gradients and said radio-frequency pulses on the position of the implant in said virtual playing out of said part of said magnetic resonance data acquisition procedure.

5. A method as claimed in claim 4 comprising establishing said load parameter by establishing a plurality of values of said load parameter dependent on said position information by repeatedly virtually playing out said part of said magnetic resonance data acquisition procedure respectively with said plurality of values of said at least one predetermined imaging parameter.

6. A method as claimed in claim 5 comprising establishing a limit value in said computer for said load parameter of said implant, and comparing each of said plurality of established values of said load parameter with said limit value when planning said magnetic resonance data acquisition procedure.

7. A method as claimed in claim 1 comprising establishing said load parameter by establishing a plurality of values of said load parameter respectively dependent on a plurality of values of said at least one predetermined imaging parameter.

8. A method as claimed in claim 1 comprising, via a user interface of said computer, setting a range of values for said at least one predetermined imaging parameter, and adhering to said range of values when planning said magnetic resonance data acquisition procedure.

9. A method as claimed in claim 8 comprising setting said range of values for said at least one predetermined imaging parameter based on a comparison of a plurality of established values of said load parameter with a limit value.

10. A planning computer for planning acquisition of magnetic resonance data from an examination subject having a body that contains an implant, said planning computer comprising:
   a processor provided with position information that describes a position of the implant within the body of the subject;
   said processor being configured to predetermine at least one imaging parameter for use in acquiring magnetic resonance data from the subject by operation of a magnetic resonance data acquisition scanner in a magnetic resonance data acquisition procedure;
   said processor being configured to establish a load parameter of the implant dependent on the position information and the at least one predetermined imaging parameter by executing a virtual playing out of a portion of said magnetic resonance data acquisition procedure with said at least one predetermined imaging parameter; and
   said processor being configured to plan, dependent on said load parameter, operation of the magnetic resonance data acquisition scanner to acquire said magnetic resonance data from the subject, and thereby generate a planned version of said magnetic resonance data acquisition procedure, and to emit an electronic representation of the planned version of said magnetic resonance data acquisition procedure in a format for operating the magnetic resonance data acquisition scanner.

11. A magnetic resonance apparatus comprising:

a magnetic resonance data acquisition scanner configured to acquire magnetic resonance data, in a magnetic resonance data acquisition procedure, from an examination subject having a body in which an implant is situated;

a computer provided with position information that describes a position of the implant within the body of the subject;

said computer being configured to predetermine at least one imaging parameter for acquiring magnetic resonance data from the subject by operation of a magnetic resonance data acquisition scanner by executing a virtual playing out of a portion of said magnetic resonance data acquisition procedure with said at least one predetermined imaging parameter;

said computer being configured to establish a load parameter of the implant dependent on the position information and the at least one predetermined imaging parameter; and said computer being configured to plan, dependent on said load parameter, operation of the magnetic resonance data acquisition scanner to acquire said magnetic resonance data from the subject, and thereby generate a planned version of said magnetic resonance data acquisition procedure, and to emit an electronic representation of the planned version of said magnetic resonance data acquisition procedure in a format for operating the magnetic resonance data acquisition scanner.

12. A non-transitory, computer-readable data storage medium encoded with programming instructions, said storage medium being loaded into a computer of a magnetic resonance apparatus comprising a magnetic resonance data acquisition scanner, said programming instructions causing said computer to plan acquisition of magnetic resonance data, in a magnetic resonance data acquisition procedure, from an examination subject having a body in which an implant is situated, by:

receiving position information that describes a position of the implant within the body of the subject;

predetermining at least one imaging parameter for acquiring magnetic resonance data from the subject by operation of a magnetic resonance data acquisition scanner by executing a virtual playing out of a portion of said magnetic resonance data acquisition procedure with said at least one predetermined imaging parameter;

establishing a load parameter of the implant dependent on the position information and the at least one predetermined imaging parameter; and planning, dependent on said load parameter, operation of the magnetic resonance data acquisition scanner to acquire said magnetic resonance data from the subject, and thereby generating a planned version of said magnetic resonance data acquisition procedure, and emitting an electronic representation of the planned version of said magnetic resonance data acquisition procedure in a format for operating the magnetic resonance data acquisition scanner.

* * * * *